US009502135B2

(12) United States Patent
Zeng et al.

(10) Patent No.: US 9,502,135 B2
(45) Date of Patent: Nov. 22, 2016

(54) SHIFT REGISTER UNIT, GATE DRIVING APPARATUS AND DISPLAY DEVICE (71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Mian Zeng, Beijing (CN); Xiaohe Li, Beijing (CN); Jaikwang Kim, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 102 days.

(21) Appl. No.: 14/370,419

(22) PCT Filed: May 21, 2013

(86) PCT No.: PCT/CN2013/075993
§ 371 (c)(1),
(2) Date: Jul. 2, 2014

(87) PCT Pub. No.: WO2014/131250
PCT Pub. Date: Sep. 4, 2014

(65) Prior Publication Data
US 2015/0302935 A1    Oct. 22, 2015

(30) Foreign Application Priority Data

Mar. 1, 2013    (CN) .......................... 2013 1 0065976

(51) Int. Cl.
G11C 19/00    (2006.01)
G11C 19/28    (2006.01)
(Continued)

(52) U.S. Cl.
CPC ................ G11C 19/28 (2013.01); G09G 3/20 (2013.01); G09G 3/3648 (2013.01); G09G 2300/0809 (2013.01); G09G 2310/0267 (2013.01); G09G 2310/0286 (2013.01)

(58) Field of Classification Search
None
See application file for complete search history.

(56) References Cited

U.S. PATENT DOCUMENTS 7,317,780 B2 * 1/2008 Lin ...................... G09G 3/3648
326/93
7,342,568 B2 * 3/2008 Wei ........................ G11C 19/28
326/97
(Continued)

FOREIGN PATENT DOCUMENTS

CN    102682689 A    9/2012
CN    102945650 A    2/2013
(Continued)

OTHER PUBLICATIONS

Sep. 1, 2015—International Preliminary Report on Patentability Appn PCT/CN2013/075993 with English Tran.
(Continued)

Primary Examiner — Tuan T Lam
(74) Attorney, Agent, or Firm — Banner & Witcoff, Ltd.

(57) ABSTRACT

Provided is a shift register unit, a gate driving apparatus and a display device capable of increasing a lifespan of a shift register. The shift register unit according to the present disclosure includes: a first thin film field effect transistor, a drain thereof connected with a first signal terminal, a source thereof connected with the outputting node at the present stage, a gate thereof connected with a first node; a second thin film field effect transistor, a drain thereof connected with the first signal terminal, a source thereof connected with the pulling-up node, and a gate thereof connected with the first node; a third thin film field effect transistor, a drain thereof connected with a second signal terminal, a source thereof connected with the outputting node at the present stage, and a gate thereof connected with a second node; a fourth thin film field effect transistor, a drain thereof connected with the second signal terminal, a source thereof connected with the pulling-up node, and a gate thereof connected with the second node; and a node voltage control module, configured to control the first node and the second node to be in a high potential state alternatively when the shift register unit is in a pulling-down phase. The present disclosure increases the lifespan of the shift register.

19 Claims, 5 Drawing Sheets (51) Int. Cl.
  *G09G 3/20* (2006.01)
  *G09G 3/36* (2006.01)

(56) References Cited

U.S. PATENT DOCUMENTS

| | | | | |
|---|---|---|---|---|
| 8,109,039 B2* | 2/2012 | Kruger | ............... | B60J 5/0416 49/348 |
| 2007/0086558 A1* | 4/2007 | Wei | ............... | G11C 19/28 377/64 |
| 2008/0219401 A1* | 9/2008 | Tobita | ............... | G09G 3/3677 377/79 |
| 2009/0304138 A1* | 12/2009 | Tsai | ............... | G11C 19/28 377/79 |
| 2011/0255653 A1* | 10/2011 | Chae | ............... | G09G 3/3677 377/79 |
| 2011/0286572 A1* | 11/2011 | Shang | ............... | G11C 19/28 377/67 |
| 2012/0113088 A1* | 5/2012 | Han | ............... | G09G 3/3674 345/212 |
| 2012/0269316 A1* | 10/2012 | Jang | ............... | G09G 3/3677 377/75 |
| 2014/0091997 A1* | 4/2014 | Han | ............... | G09G 3/3677 345/92 |
| 2014/0119491 A1* | 5/2014 | Liu | ............... | G11C 19/28 377/64 |
| 2014/0119493 A1* | 5/2014 | Yang | ............... | G11C 19/28 377/64 |
| 2014/0168050 A1* | 6/2014 | Gu | ............... | G09G 3/3611 345/100 |
| 2014/0253424 A1* | 9/2014 | Yu | ............... | G11C 19/28 345/100 |
| 2015/0248940 A1 | 9/2015 | Yang et al. | | |
| 2015/0339997 A1 | 11/2015 | Yang et al. | | |

FOREIGN PATENT DOCUMENTS

| | | |
|---|---|---|
| KR | 20080031114 A | 4/2008 |
| KR | 20080081822 A | 9/2008 |
| KR | 1020080031114 A | 10/2009 |
| KR | 1020080081822 A | 3/2010 |
| KR | 20120028333 A | 3/2012 |
| KR | 1020120028333 A | 9/2013 |

OTHER PUBLICATIONS

Jan. 11, 2016—(KR)—Office Action Appn 10-2014-7019355 with English Iran.
Sep. 6, 2016—(EP) Extended Search Report—App. No. 13866489.1.

* cited by examiner

--Prior Art--

SHIFT REGISTER UNIT, GATE DRIVING APPARATUS AND DISPLAY DEVICE

CROSS REFERENCE TO RELATED APPLICATIONS

This application is based on International Application No. PCT/CN2013/075993 filed on May 21, 2013, which claims priority to Chinese National Application No. 201310065976.2 filed on Mar. 1, 2013. The entire contents of each and every foregoing application are incorporated herein by reference.

TECHNICAL FIELD

The present disclosure relates to a field of shift register technique, and more particularly, to a shift register unit, a gate driving apparatus and a display device.

BACKGROUND

An integrated gate shift register integrates a gate pulse output register on a panel so as to reduce the number of ICs and decrease the cost. Implementations for the integrated gate shift register are various and may comprise different numbers of transistors and capacitors, and its common structure is, for example, 12T1C, 9T1C, 13T1C, etc.

Generally, one shift register comprises a plurality of stages of shift register units, and each stage of shift register unit outputs a high potential signal only during a very short time and outputs a low potential signal, generally as a VSS signal, during other time.

As mentioned above, each stage of shift register unit outputs the high potential signal only during the very short time and outputs the low potential signal during other time which occupies above 99% commonly. Meanwhile, the VSS signal is always outputted by a pulling-down transistor, and when it is required that the shift register unit outputs a low potential signal, the pulling-down transistor is required being in a turn-on state by a high potential in order to pull down a potential with the VSS signal. Therefore, a gate of the pulling-down transistor is in a high potential state over a long period of time and has a very high duty ratio voltage, such that this manner would cause the pulling-down transistor to age rapidly, and alternatively a mobility of the pulling-down transistor decreases and its current decreases accordingly, which causes a fault in an entire circuit and affects a lifespan of a product.

The existing shift register unit would be described below in connection with FIG. 1.

Figure 1:
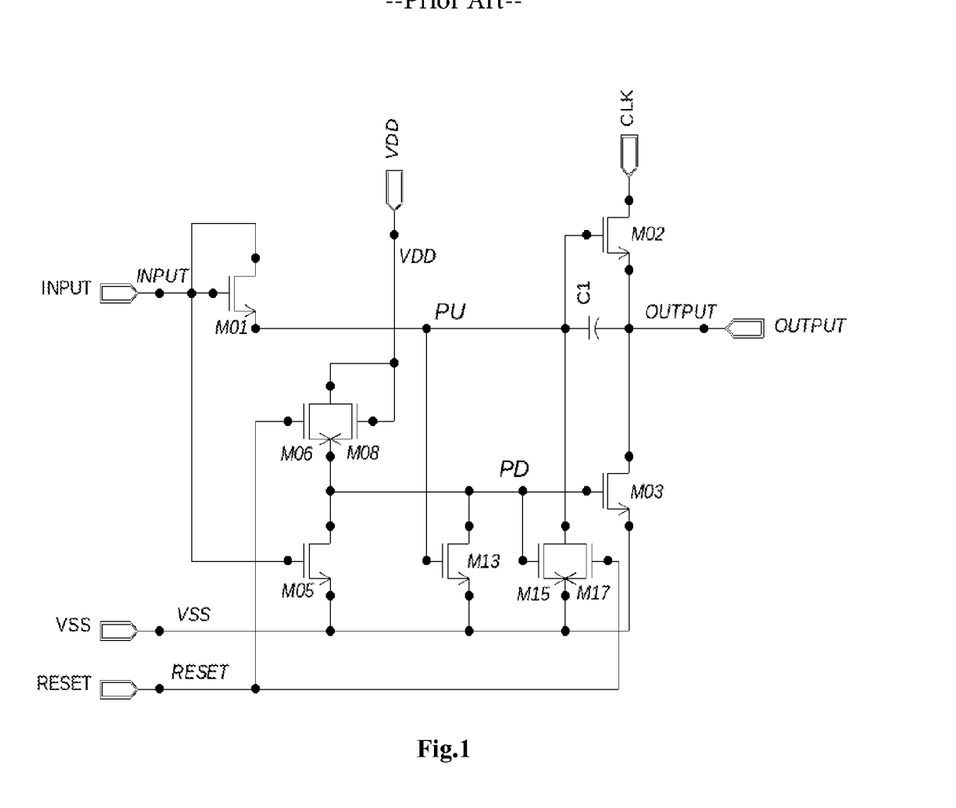
FIG. 1 is an exemplary view illustrating a structure of a known shift register unit.

FIG. 1 illustrates the existing shift register unit comprising nine thin film field effect transistors (briefly referred to as TFT thereafter) M01, M02, M03, M05, M06, M08, M13, M15, M17 and one capacitor C1. In FIG. 1, the pulling-down transistor is M03, and detailed connection relationship among respective components in the shift register unit and a principle of the shift register unit are as follows.

The TFT M02 outputs an OUTPUT to an outputting terminal according to a signal CLK inputted from a clock signal inputting terminal. A source of the TFT M02 receives the CLK signal, a drain thereof is connected with the OUTPUT terminal, and a gate thereof is connected with a pulling-up node PU; a gate and a source of the M01 are connected with an inputting terminal INPUT, and a drain thereof is connected with the pulling-up node PU; one terminal of the capacitor C1 is connected with the pulling-up node PU, and the other terminal is connected with the outputting node OUTPUT.

When the outputting terminal OUTPUT is inactive, the pulling-up node PU and the outputting node OUTPUT at a present stage are needed to be pulled down so as to keep them at a low potential. A circuit for pulling down the pulling-up node PU and the outputting node OUTPUT at the present stage comprises the TFTs M03 and M15, wherein the M15 is used to pull down a potential at the PU node while the M03 pulls down a potential at the OUTPUT node.

Gates of the TFTs M03 and M15 are connected with a PD node whose potential is controlled by the TFTs M05, M13 and M08, wherein the M05 and M13 pull down the potential at the PD node when the INPUT and PU node are at a high potential, respectively, while M08 pulls up the potential at the PD node by connecting to a VDD signal.

A circuit comprising TFTs M06 and M17 realizes a reset function. When a RESET signal outputs a high potential, the M17 discharges the PU node, and the M06 assists to charge the PD node and then turns on the M03, and further the potential at the outputting node OUTPUT is pulled down.

Figure 2:
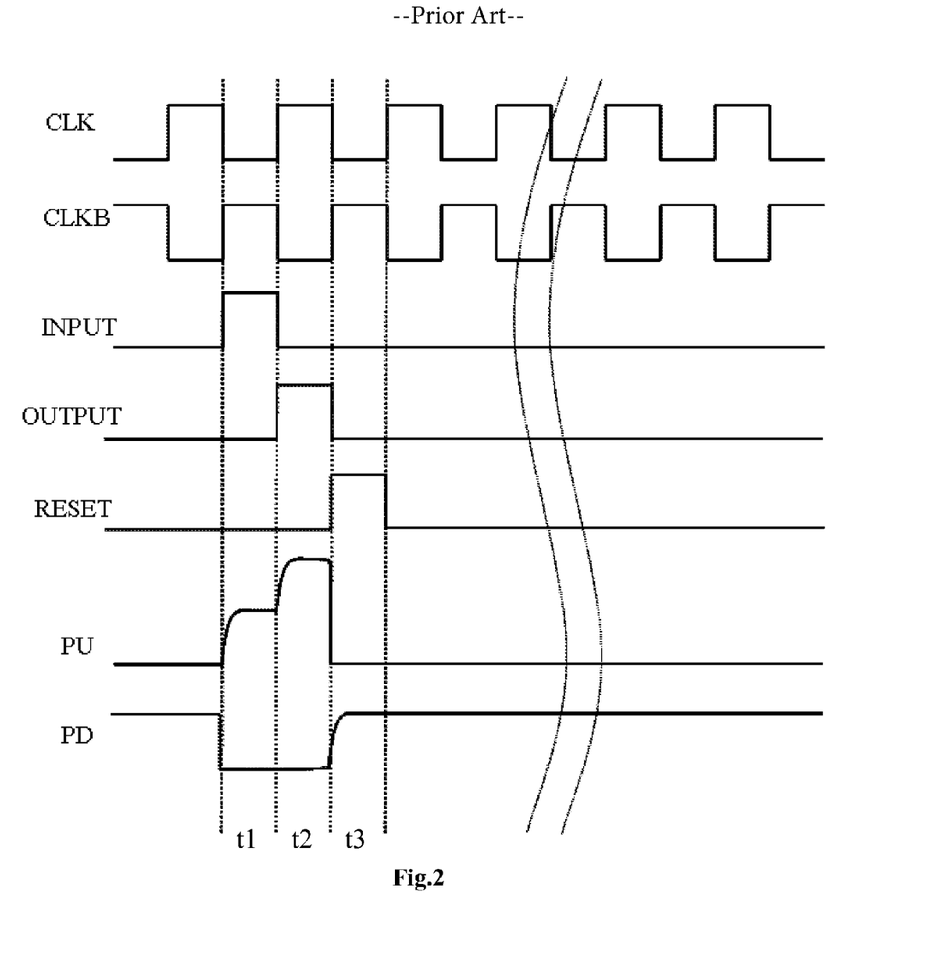
FIG. 2 is an exemplary view illustrating an operational timing of the known shift register unit.

FIG. 2 is an operational timing diagram of the shift register unit shown in FIG. 1, and its detailed operation is as follows. The VDD is always at the high potential. In a t1 phase, the inputting terminal INPUT is at the high potential, a first clock signal CLK is at the low potential, and at this time the high potential at the inputting terminal INPUT turns on the M01, and the PU node is at the high potential at this time and alternatively charges the C1, and the M02 is turned on. Meanwhile, the INPUT signal pulls down the potential at the PD node through the M05, and the M03 is in a turn-off state at this time.

In a t2 phase, the INPUT becomes to the low potential, the first clock signal CLK is at the high potential, the capacitor C1 which is charged during the t1 phase cause a voltage at the pulling-up node PU to rise up further under a function of a bootstrap effect of the C1, the M02 remains to be in the turn-on state, and the CLK signal is transferred to the outputting terminal OUTPUT through the M02. During the t2 phase, the PU node is at the high potential all the time, the M13 is turned on, the PD is at the low potential, the M03 and M15 are turned off, and the outputting terminal OUTPUT outputs the high potential signal.

In a t3 phase, the RESET is at the high potential; at this time, the RESET turns on the M17 so as to discharge the PU node. At the same time, the M06 is also turned on, the VDD transfers the high potential to the PD node so as to cause the M15 and M03 to be turned on, so that the PU node and the outputting node OUTPUT are discharged simultaneously. During this phase, the outputting terminal OUTPUT outputs the low potential signal.

During a period of frame thereafter, the PD is in the high potential state all the time, so that the M15, M03 and M08 are in the turn-on state all the time while other transistors are in the turn-off state. In a case that a liquid crystal panel is in operation for a long time, the lifespan of these three transistors would become a critical factor for a lifespan of the entire gate driving apparatus, since the operation time of these three transistors are far longer than those of other transistors.

SUMMARY

Embodiments of the present disclosure provide a shift register unit, a gate driving apparatus and display device, which are capable of increasing a lifespan of a shift register.

The embodiments of the present disclosure provide a shift register unit comprising a capacitor, wherein one terminal of the capacitor is connected with an outputting node at a present stage, and the other terminal of the capacitor is connected with a pulling-up node, the shift register unit further comprises:

a first thin film field effect transistor, wherein a drain thereof is connected with a first signal terminal, a source thereof is connected with the outputting node at the present stage, a gate thereof is connected with a first node; wherein the first signal terminal outputs a low potential signal when the first thin film field effect transistor is turned on;

a second thin film field effect transistor, wherein a drain thereof is connected with the first signal terminal, a source thereof is connected with the pulling-up node, and a gate thereof is connected with the first node; wherein the first signal terminal outputs a low potential signal when the second thin film field effect transistor is turned on;

a third thin film field effect transistor, wherein a drain thereof is connected with a second signal terminal, a source thereof is connected with the outputting node at the present stage, and a gate thereof is connected with a second node; wherein the second signal terminal outputs a low potential signal when the third thin film field effect transistor is turned on;

a fourth thin film field effect transistor, wherein a drain thereof is connected with the second signal terminal, a source thereof is connected with the pulling-up node, and a gate thereof is connected with the second node; wherein the second signal terminal outputs a low potential signal when the fourth thin film field effect transistor is turned on; and a node voltage control module, configured to control the first node and the second node to be in a high potential state alternatively when the shift register unit is in a pulling-down phase.

In an example, the shift register unit further comprises:

a first association unit, configured to output a low potential signal to the first node and the second node when the pulling-up node is at a high potential.

In an example, in the shift register unit:

the node voltage control module comprises a first node voltage control sub-module and a second node voltage control sub-module;

wherein the first node voltage control sub-module comprises:

a fifth thin film field effect transistor, wherein a source and a gate thereof receive a first clock control signal, and a drain thereof is connected with the first node; and a sixth thin film field effect transistor, wherein a drain thereof receives the low potential signal, a source thereof is connected with the second node, and a gate thereof receives the first clock control signal, the second node voltage control sub-module comprises:

a seventh thin film field effect transistor, wherein a source and a gate thereof receive a second clock control signal, and a drain thereof is connected with the second node; and an eighth thin film field effect transistor, wherein a drain thereof receives the low potential signal, a source thereof is connected with the first node, and a gate thereof receives the second clock control signal, phases of the second clock control signal and the first clock control signal are opposite.

In an example, the shift register unit further comprises a first resetting unit configured to output a low potential signal to the pulling-up node and the outputting node at the present stage under a control of a reset signal, and the first resetting unit comprises:

a ninth thin film field effect transistor, wherein a drain thereof receives the low potential signal, a source thereof is connected with the pulling-up node, and a gate thereof receives the reset signal;

a tenth thin film field effect transistor, wherein a source thereof receives the first clock control signal, a drain thereof is connected with the first node, and a gate thereof receives the reset signal; and an eleventh thin film field effect transistor, wherein a source thereof receives the second clock control signal, a drain thereof is connected with the second node, and a gate thereof receives the reset signal.

In an example, in the shift register unit:

the node voltage control module comprises a third node voltage control sub-module and a fourth node voltage control sub-module, the third node voltage control sub-module comprises:

a twelfth thin film field effect transistor, wherein a source and a gate thereof receive a third clock control signal, and a drain thereof is connected with a gate of a thirteenth thin film field effect transistor;

the thirteenth thin film field effect transistor, wherein a source thereof receives the third clock control signal and a drain thereof is connected with the first node; and a fourteenth thin film field effect transistor, wherein a drain thereof receives the low potential signal, a source thereof is connected with the second node, and a gate thereof receives the third clock control signal, the fourth node voltage control sub-module comprises:

a fifteenth thin film field effect transistor, wherein a source and a gate thereof receive a fourth clock control signal, and a drain thereof is connected with a gate of a sixteenth thin film field effect transistor;

the sixteenth thin film field effect transistor, wherein a source thereof receives the fourth clock control signal and a drain thereof is connected with the second node; and a seventeenth thin film field effect transistor, wherein a drain thereof receives the low potential signal, a source thereof is connected with the first node, and a gate thereof receives the fourth clock control signal, phases of the fourth clock control signal and the third clock control signal are opposite.

In an example, the shift register unit further comprises:

a second association unit, configured to turn off both the thirteenth thin film field effect transistor and the sixteenth thin film field effect transistor when the pulling-up node is at the high potential, and meanwhile to output the low potential signal to the first node and the second node.

In an example, the shift register unit further comprises a second resetting unit configured to output the low potential signal to the pulling-up node and the outputting node at the present stage under the control of the reset signal, and the second resetting unit comprises:

an eighteenth thin film field effect transistor, wherein a drain thereof receives the low potential signal, a source thereof is connected with the pulling-up node, and a gate thereof receives the reset signal; and a nineteenth thin film field effect transistor, wherein a drain thereof receives the low potential signal, a source thereof is connected with the outputting node at the present stage, and a gate thereof receives the reset signal.

The embodiments of the present disclosure provide a gate driving apparatus comprising the shift register unit described above.

The embodiments of the present disclosure further provide a display device comprising the gate driving apparatus.

Embodiments of the present disclosure can achieve beneficial effects as follows.

In the embodiments of the present disclosure, the first node and the second node are in the high potential state alternatively under the control of the node voltage control module, and in turn the gates of two sets of TFTs (the first TFT and the second TFT form one set, while the third TFT and the fourth TFT form another set) are in the high potential state alternatively; therefore the gates of each set of TFTs are in the high potential state only during a part of time of any one pulling-down phase. As compared with the know technique in which the gate of the transistor is always in the high potential state during the pulling-down phase, a duty ratio voltage of a pulling-down transistor is decreased greatly and the lifespan of the pulling-down transistor is increased, so that the lifespan of the entire shift register unit is increased.

DETAILED DESCRIPTION

In a shift register unit, a gate driving apparatus and a display device according to the embodiments of the present disclosure, in order to pull down a pulling-up node PU and an outputting node, two sets of pulling-down TFTs operate alternatively to pull down the pulling-up node and the outputting node, so that a turn-on duration of the each set of pulling-down TFTs decreases in a pulling-down phase; therefore, a lifespan of a pulling-down transistor in a pulling-down module can be increased, and a lifespan of the entire shift register unit can be increased.

It should be noted previously that a source and a drain of the TFT mentioned in the embodiments of the present disclosure can be interchanged.

The embodiments of the present disclosure provide a shift register unit comprising a capacitor, wherein one terminal of the capacitor is connected with an outputting node at a present stage, and the other terminal of the capacitor is connected with a pulling-up node, the shift register unit further comprises:

a first thin film field effect transistor, a drain thereof is connected with a first signal terminal, a source thereof is connected with the outputting node at the present stage, a gate thereof is connected with a first node; wherein the first signal terminal outputs a low potential signal when the first thin film field effect transistor is turned on;

a second thin film field effect transistor, a drain thereof is connected with the first signal terminal, a source thereof is connected with the pulling-up node, and a gate thereof is connected with the first node; wherein the first signal terminal outputs a low potential signal when the second thin film field effect transistor is turned on;

a third thin film field effect transistor, a drain thereof is connected with a second signal terminal, a source thereof is connected with the outputting node at the present stage, and a gate thereof is connected with a second node; wherein the second signal terminal outputs a low potential signal when the third thin film field effect transistor is turned on;

a fourth thin film field effect transistor, a drain thereof is connected with the second signal terminal, a source thereof is connected with the pulling-up node, and a gate thereof is connected with the second node; wherein the second signal terminal outputs a low potential signal when the fourth thin film field effect transistor is turned on; and a node voltage control module, configured to control the first node and the second node to be in a high potential state alternatively when the shift register unit is in a pulling-down phase.

It should be noted that, in the embodiments of the present disclosure, both of the first signal terminal and the second signal terminal are connected with the low potential signal VSS, but signals for the first signal terminal and the second signal terminal are not limited thereto, as long as the first signal terminal can output a low potential signal when the first thin film field effect transistor and the second thin film field effect transistor are turned on while the second signal terminal can output a low potential signal when the third thin film field effect transistor and the fourth thin film field effect transistor are turned on.

In an embodiment of the present disclosure, the first node and the second node are in the high potential state alternatively under the control of the node voltage control module, and then the gates of two sets of TFTs (the first TFT and the second TFT form one set, while the third TFT and the fourth TFT form another set) are in the high potential state alternatively; therefore, the gates of each set of TFTs are in the high potential state only during a part of duration in any pulling-down phase (their turn-on duration decreases). As compared with the known technique in which the gate of the transistor is always in the high potential state during the pulling-down phase, a duty ratio voltage of the gate of a pulling-down transistor is greatly decreased and the lifespan of the pulling-down transistor is increased, so that the lifespan of the entire shift register unit is increased. In particular, the first thin film field effect transistor in the first set of TFTs and the third thin film field effect transistor in the second set of TFTs are the pulling-down transistor.

Figure 3:
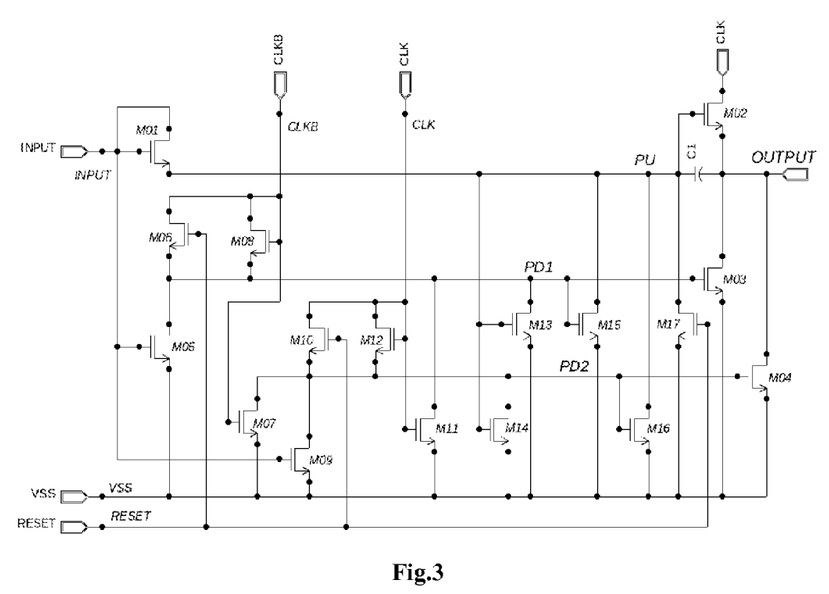
FIG. 3 is an exemplary view illustrating a structure of a shift register unit according to the embodiments of the present disclosure.
Figure 5:
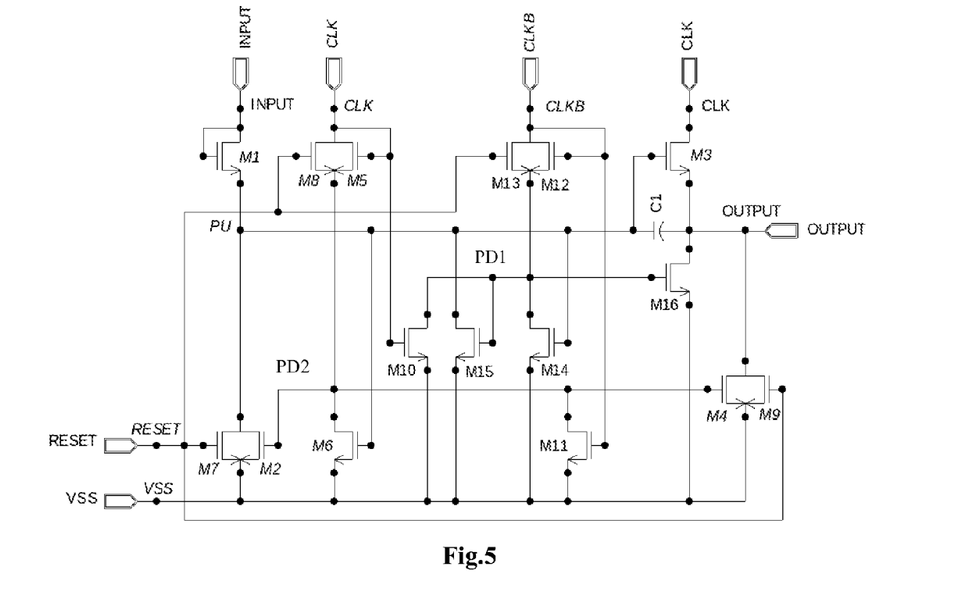
FIG. 5 is an exemplary view illustrating a structure of another shift register unit according to the embodiments of the present disclosure.
Figure 6:
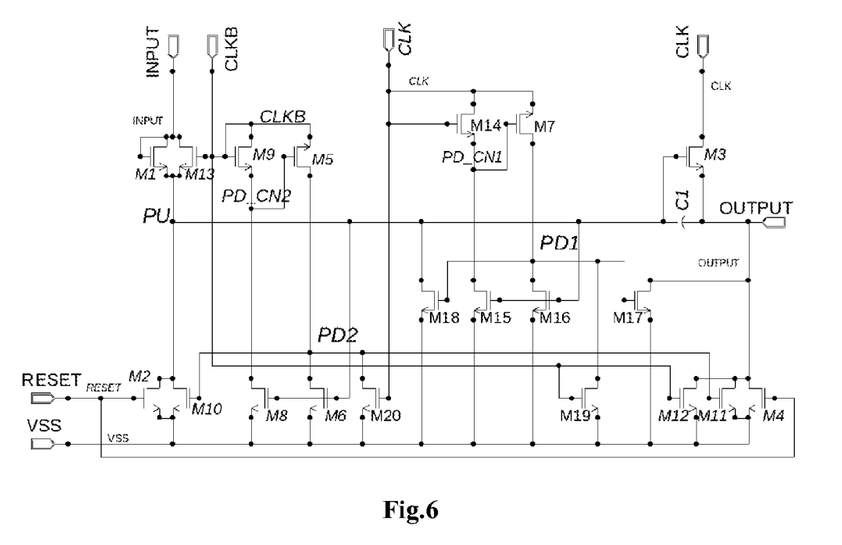
FIG. 6 is an exemplary view illustrating a structure of a further shift register unit according to the embodiments of the present disclosure.

FIGS. 3, 5 and 6 are the exemplary views for three different shift register units according to the embodiments of the present disclosure, respectively. In FIG. 3, the first to fourth TFTs are TFT M03, TFT M15, TFT M04 and TFT M16, respectively;

in FIG. 5, the first to fourth TFTs are TFT M16, TFT M15, TFT M4 and TFT M2, respectively;

in FIG. 6, the first to fourth TFTs are TFT M17, TFT M18, TFT M11 and TFT M10; and C1 illustrated in FIGS. 3, 5 and 6 represents the capacitor, PU represents the pulling-up node, and PD1 and PD2 correspond to the first node and the second node, respectively.

It can be known based on an operational principle of a shift register, the first node and the second node should be at a low potential when the pulling-up node is at a high potential, therefore the shift register unit according to an embodiment of the present disclosure further comprises:

a first association unit, configured to output a low potential signal to the first node and the second node when the pulling-up node is at a high potential.

To realize a simple structure, the first association unit may comprise two TFTs, gates of these two TFTs are connected with the pulling-up node, both drains thereof may receive the low potential signal VSS and the sources thereof are connected with the first node and the second node, respectively. Thus, both of the TFTs are turned on when the pulling-up node is at the high potential, and the first node and the second node are pulled down by the low potential signal VSS, respectively.

As illustrated in FIG. 3, the two TFTs included in the first association unit are M13 and M14, respectively;

As illustrated in FIG. 5, the two TFTs included in the first association unit are M6 and M14, respectively.

In an embodiment of the present disclosure, the node voltage control module may be realized in many modes, and one modes used in the embodiments of the present disclosure will be described below.

The node voltage control module comprises a first node voltage control sub-module and a second node voltage control sub-module;

wherein the first node voltage control sub-module comprises:

a fifth thin film field effect transistor, wherein a source and a gate thereof receive a first clock control signal, and a drain thereof is connected with the first node; and a sixth thin film field effect transistor, wherein a drain thereof receives the low potential signal, a source thereof is connected with the second node, and a gate thereof receives the first clock control signal, the second node voltage control sub-module comprises:

a seventh thin film field effect transistor, wherein a source and a gate thereof receive a second clock control signal, and a drain thereof is connected with the second node; and an eighth thin film field effect transistor, a drain thereof receives the low potential signal, a source thereof is connected with the first node, and a gate thereof receives the second clock control signal, wherein phase of the second clock control signal and that of the first clock control signal are opposite.

Figure 4:
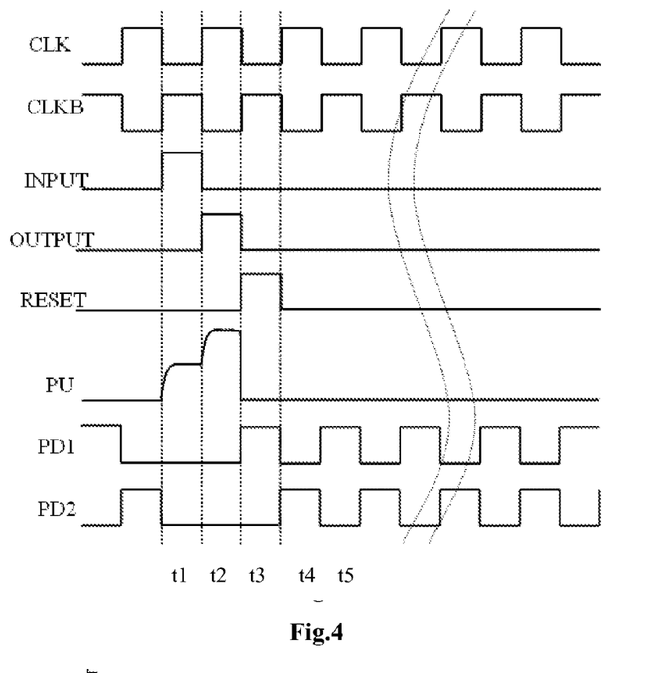
FIG. 4 is an exemplary view illustrating an operational timing of the shift register unit shown in FIG. 3.

In FIG. 3, the fifth to eighth TFTs are M08, M07, M12 and M11, respectively; in FIG. 5, the fifth to eighth TFTs are M12, M11, M5 and M10, respectively; and both in FIGS. 3 and 5, the first clock control signal is CLKB, the second clock control signal is CLK, and waveforms of the CLKB and CLK are illustrated in FIG. 4.

A case in which the node voltage control module can control the first node and the second node to be in a high potential state alternatively will be described below.

It is assumed that the first clock control signal of the first node voltage control sub-module is A and the second clock control signal of the second node voltage control sub-module is B, the A and B are in the high potential state alternatively (that is, phases of the B and A are inverted), detailed operational principles of the first node voltage control sub-module and the second node voltage control sub-module are as follows.

When the A is at a high potential, the B is at a low potential, at this time the fifth thin film field effect transistor in the first node voltage control sub-module is turned on, the A is outputted to the first node, so that the first node is at the high potential, and at the same time the sixth thin film field effect transistor is also turned on such that the second node is connected to the low potential signal VSS, thus the second node being at the low potential.

When the A is at a low potential, the B is at a high potential, at this time the seventh thin film field effect transistor is turned on, the B is outputted to the second node, so that the second node is at the high potential, and at the same time the eighth thin film field effect transistor is also turned on, such that the first node is connected to the low potential signal VSS, thus the first node being at the low potential.

With such a design, the first node and the second node can be at a high potential alternatively in the pulling-down phase, so the gates of two sets of TFTs (the first TFT and the second TFT form one set, while the third TFT and the fourth TFT form one set) are in the high potential state alternatively, then the two sets of TFTs are turned on alternatively, and the low potential signal VSS is outputted to the pulling-up node and the outputting node at the present stage.

In an embodiment of the present disclosure, the shift register unit further comprises a first resetting unit configured to output a low potential signal to the pulling-up node and the outputting node at the present stage under a control of a reset signal.

The first resetting unit comprises:

a ninth thin film field effect transistor, a drain thereof receives the low potential signal, a source thereof is connected with the pulling-up node, and a gate thereof receives the reset signal;

a tenth thin film field effect transistor, a source thereof receives the first clock control signal, a drain thereof is connected with the first node, and a gate thereof receives the reset signal; and an eleventh thin film field effect transistor, a source thereof receives the second clock control signal, a drain thereof is connected with the second node, and a gate thereof receives the reset signal.

The ninth thin film field effect transistor is used to output the low potential signal VSS to the pulling-up node so as to pull down a potential at the pulling-up node when the reset signal (may be an output signal from a next stage of shift register unit, or also may be another signal) is at a high level.

Also, the tenth TFT and the eleventh TFT are configured to output a control signal currently at the high potential to corresponding nodes (the first node or the second node), so that the one set of the thin film field effect transistors TFTs are turned on by the first or second node at the high potential, and the low potential signal is outputted to the PU node and the outputting node at the present stage, thus realizing a dual pulling-down, which can ensure a reset effect.

As illustrated in FIG. 3, the ninth to eleventh TFTs are M17, M06 and M10, respectively.

According to the embodiments of the present disclosure, another implementation of the node voltage control module is as follows.

The node voltage control module comprises a third node voltage control sub-module and a fourth node voltage control sub-module, as illustrated in FIG. 6, the third node voltage control sub-module comprises:

a twelfth thin film field effect transistor TFT (M14), a source and a gate thereof receive a third clock control signal CLK, and a drain thereof is connected with a gate of a thirteenth thin film field effect transistor TFT (M7);

the thirteenth thin film field effect transistor TFT (M7), a source thereof receives the third clock control signal CLK and a drain thereof is connected with the first node PD1; and a fourteenth thin film field effect transistor TFT (M20), a drain thereof receives the low potential signal VSS, a source thereof is connected with the second node PD2, and a gate thereof receives the third clock control signal CLK, the fourth node voltage control sub-module comprises:

a fifteenth thin film field effect transistor TFT (M9), a source and a gate thereof receive a fourth clock control signal, and a drain thereof is connected with a gate of a sixteenth thin film field effect transistor TFT (M5);

the sixteenth thin film field effect transistor TFT (M5), a source thereof receives the fourth clock control signal CLKB and a drain thereof is connected with the second node PD2; and a seventeenth thin film field effect transistor TFT (M19), a drain thereof receives the low potential signal VSS, a source thereof is connected with the first node PD1, and a gate thereof receives the fourth clock control signal CLKB, phases of the fourth clock control signal CLKB and the third clock control signal CLK are opposite.

In a detailed embodiment of the present disclosure, the shift register unit further comprises: a second association unit, configured to turn off both the thirteenth thin film field effect transistor and the sixteenth thin film field effect transistor when the pulling-up node is at a high potential, and meanwhile to output a low potential signal to the first node and the second node.

As illustrated in FIG. 6, when the PU node is at the high potential, the M8 and M15, which form the second association unit, output a low potential signal to the gates of the TFTs M5 and M7 so as to turn off the TFTs M5 and M7, such that a corresponding high potential signal can not be outputted to the first node and the second node, thus ensuring the device to operate normally.

In this case, the shift register unit further comprises a second resetting unit configured to output the low potential signal to the pulling-up node and the outputting node at the present stage under the control of the reset signal, and the second resetting unit comprises:

an eighteenth thin film field effect transistor (M2), a source thereof receives the low potential signal VSS, a drain thereof is connected with the pulling-up node, and a gate thereof receives the reset signal; and a nineteenth thin film field effect transistor (M4), a source thereof receives the low potential signal VSS, a drain thereof is connected with the outputting node at the present stage, and a gate thereof is connected with the reset signal.

The embodiments of the present disclosure further provide a gate driving apparatus comprising the shift register unit described above.

The embodiments of the present disclosure further provide a display device comprising the gate driving apparatus.

The shift register unit according to the embodiments of the present disclosure will be described in details below.

EXAMPLE 1

As illustrated in FIG. 3, a shift register unit according to an embodiment of the present disclosure comprises:

a first set of pulling-down thin film field effect transistors comprising the TFTs M03 and M15;

a second set of pulling-down thin film field effect transistors comprising the TFTs M04 and M16;

these two sets of TFTs correspond to the first node PD1 and the second node PD2, respectively, and the first set of TFTs and the second set of TFTs are turned on alternatively when the nodes PD1 and PD2 are at a high potential alternatively. The potentials at the PU node and the OUTPUT node can be pulled down when any one of the sets of TFTs are turned on.

Further, the above shift register unit also comprises a first node voltage control sub-module comprising the M08, M07 and a second node voltage control sub-module comprising the M11, M12. The first node voltage control sub-module and the second node voltage control sub-module control the potentials at the first node and the second node, respectively, under the control of the respective first clock control signal CLKB and the second clock control signal CLK. In particular, in the first node voltage control sub-module, the thin film field effect transistor M08 controls the potential at the first node PD1, while the thin film field effect transistor M07 controls the potential at the second node PD2; when the first clock control signal CLKB is at the high potential, both of the M08 and M07 are turned on, so the CLKB signal is outputted to the PD1, the low potential signal VSS may be transferred to the second node PD2 through the M07, and at this time the first node PD1 at the high potential and the PD2 is at the low potential; when the CLKB signal is at the low potential, both of the M08 and M07 are turned off, and at this time the potentials at the PD1 and the PD2 are controlled by the second node voltage control sub-module. In the second node voltage control sub-module, the thin film field effect transistor M11 controls the potential at the first node PD1, while the thin film field effect transistor M12 controls the potential at the second node PD2; when the second clock control signal CLK is at the high potential, both of the M11 and M12 are turned on, so the CLK signal is outputted to the PD2 through the M12, the VSS is outputted to the PD1 through the M11, and at this time the PD1 is at the low potential and the PD2 is at the high potential; when the CLK signal is at the low potential, both of the M11 and M12 are turned off, and at this time the potentials at the PD1 and the PD2 are controlled by the first node voltage control sub-module.

Therefore, the PD1 and PD2 are at the high potential alternatively when the CLKB and CLK are at the high potential alternatively.

In the circuit structure shown in FIG. 3, the association unit is further included and the association unit comprises the M13 and the M14, both gates thereof are connected with the PU, both drains thereof receives VSS, and both sources thereof are connected with the PD1 and PD2, respectively. When the PU is at the high potential, the M13 and M14 are turned on, and the potentials at the PD1 and PD2 are the low potential signal VSS.

In the circuit structure shown in FIG. 3, the resetting unit is further included and the resetting unit comprises following TFTs: M06, M10 and M17. When a reset signal terminal RESET is inputted a high potential signal, M06, M10 and M17 are turned on, wherein the turning-on of the M17 may pull down the PU node, while the turning-on of the M06 and M10 may input the CLKB signal to the PD1 and input the CLK signal to the PD2. Since one of the CLKB and the CLK is at the high potential, either the TFTs M03 and M15 are turned on, or the TFTs M05 and M16 are turned on, and thus the PU and OUTPUT are pulled down.

A signal timing of the shift register unit with the structure shown in FIG. 3 is as illustrated in FIG. 4, and its detailed operational process will be described in connection with FIGS. 3-4.

In a first phase (namely a t1 phase), when the input signal INPUT is at the high potential, the first clock control signal CLKB is at the high potential and the second clock control signal CLK is at the low potential, the high potential from the inputting terminal charges the C1 through the M01; the INPUT pulls down the nodes PD1 and PD2 by turning on the M05 and M09. At this time, both of the M13 and M14 are turned on since the PU node is at the high potential, so that the nodes PD1 and PD2 are at the low potential, and the pulling-down module M15, M16 and M03, M04 are turned off.

In a second phase (namely a t2 phase), when the INPUT and the CLKB are at the low potential and the second clock control signal CLK is at the high potential, the capacitor C1 which is charged during the previous phase makes the voltage at the pulling-up node further rise up, under a function of a bootstrap effect, in order to maintain the turning-on of the M02 and transfer the CLK signal to the gate voltage outputting terminal OUTPUT through the M02. The PU node is at the high potential at this time, the M13 and M14 are turned on, the nodes PD1 and PD2 are at the low potential, and the M15, M16 and M03, M04 continue in the turn-off state, which is benefit to transfer the high potential signal to the outputting terminal OUTPUT.

In a third phase (namely a t3 phase), the CLKB is at the high potential, the CLK is at the low potential while the RESET is at the high potential; at this time, the RESET turns on the M06, M10 and M17, wherein the M17 is turned on so as to discharge the PU node, so that the turn-off of the PU node is realized. The CLKB is at the high potential, the M07 is turned on, and the node PD2 connected to the source of the M07 is pulled down. The CLK is at the low potential, the M11 is turned off, the node PD1 is at the high potential by receiving the input of the CLKB through the M06, and at this time the M15 connected with the node PD1 pulls down the potential at the PU node, meanwhile the M03 is turned on to pull down the OUTPUT. During this phase, the node PD2 is at the low potential, the M16 and M04 are turned off. The PU node and the OUTPUT node are discharged through the M15 and M03 in this phase.

A fourth phase (namely a t4 phase), when the CLK is at the high potential and the CLKB is at the low potential, since the PU node is set at the low potential in the previous phase, the M02 is turned off at this time, so that no high potential is outputted from the OUTPUT terminal. Since the CLK is at the high potential, both of the M11 and M12 are turned on at this time, the node PD1 at the low potential, the M15 and M03 are turned off, and the first pulling-down module is switched off. Further, Since the CLKB is at the low potential, the M07 is turned off, the CLK signal is outputted to the second node PD2 through the M12 at this time, and the PD2 is at the high potential, therefore the M16 and M04 are turned on, the PU node is pulled down to the low potential through the M16 while the OUTPUT is pulled down to the low potential through the M04, so that effects due to noise voltages on the PU node and the terminal OUTPUT are reduced and it is ensured that the outputs of the PU node and the terminal OUTPUT is free of the noise. The PU node and the OUTPUT node are discharged by the M16 and M04 in this phase, respectively.

A fifth phase (namely a t5 phase), when the CLKB is at the high potential and the CLK is at the low potential, the M07 and M08 are turned on since the CLKB is at the high potential, and the node PD2 is pulled down through the transistor M07; meanwhile the CLK is at the low potential, M11 is turned off, the node PD1 is set at the high potential through the CLKB, and at this time the M15 pulls down the potential at the PU node and M03 pulls down the OUTPUT.

During a display of a frame comprising the above phases, the shift register unit repeats the above fourth and fifth phases, except for other phases among the five phases, until a display of a next frame starts.

The nodes PD1 and PD2 are at the high potential and the low potential alternatively under functions of the two switching thin film field effect transistors TFTs M11 and M07, respectively, which reduces the turn-on duration of the pulling-down transistor, so that the lifespan of the shift register is increased effectively.

EXAMPLE 2

FIG. 5 is an exemplary view illustrating another implementation of the shift register unit according to the embodiments of the present disclosure.

As illustrated in FIG. 5, the shift register unit according to the embodiments of the present disclosure comprises:

a first set of TFTs comprising the TFTs M15 and M16;

a second set of TFTs comprising the TFTs M4 and M2;

these two sets of TFTs correspond to the first node PD1 and the second node PD2, respectively, and the first set of TFTs and the second set of TFTs are turned on alternatively when the nodes PD1 and PD2 are at the high potential alternatively. The potentials at the PU node and the OUTPUT node can be pulled down when any one of the sets of TFTs are turned on.

Further, the above shift register unit further comprises a first node voltage control sub-module comprising M11 and M12 and a second node voltage control sub-module comprising M5 and M10. The potential at the node PD2 is controlled by the TFT M5 while the potential at the node PD1 is controlled by the TFT M12. When the CLK signal is at the high potential, the M5 may be turned on and outputs the CLK signal to the PD2; and when the CLKB is at the high potential, the M12 may be turned on and outputs the CLK signal to the PD1.

Meanwhile, when one node is at the high potential, the potential at the other node would be pulled down by another TFT. Particularly, as illustrated in FIG. 5, Since the gate and the source of the M5 receives the CLK, the PD2 is at the high potential when the CLK is at the high potential, and the turning-on of the M10 may pull down the potential at the PD1, while the PD1 is at the high potential when the CLKB is at the high potential, and the turning-on of the M11 may pull down the potential at the PD2.

Therefore, the PD1 and PD2 are at the high potential alternatively when the CLKB and CLK are at the high potential alternatively.

In the circuit structure shown in FIG. 5, the association unit is further included and the association unit comprises the M6 and the M14, both gates thereof are connected with the PU, both drains thereof receive the low potential signal VSS, and both sources thereof are connected with the PD2 and PD1, respectively. The M6 and M14 are turned on and output the low potential signal VSS to the PD2 and PD1, respectively, when the PU is at the high potential.

In the circuit structure shown in FIG. 5, the resetting unit comprises following TFTs: M7, M8, M9 and M13. When the reset signal terminal RESET is inputted the high potential signal, the M7, M8, M9 and M13 are turned on, wherein the turning-on of the M7 may pull down the PU node, while the turning-on of the M9 may pull down the OUTPUT node.

Further, the turning-on of the M8 and M13 may input the CLK signal to the PD1 and input the CLKB to the PD2. Since one of the CLKB and CLK is in the high potential, either the TFTs M4 and M2 are turned on, or the TFTs M15 and M16 are turned on, so that the PU and OUTPUT are pulled down.

An operational process of the shift register shown in FIG. 5 is substantively same as that shown in FIG. 3, and details are omitted herein.

EXAMPLE 3

FIG. 6 is an exemplary view illustrating another implementation of the shift register unit according to the embodiments of the present disclosure.

As illustrated in FIG. 6, the shift register unit according to the embodiments of the present disclosure comprises:

a first set of TFTs comprising the TFTs M17 and M18;
a second set of TFTs comprising the TFTs M10 and M11;
these two sets of TFTs correspond to the first node PD1 and the second node PD2, respectively, and the first set of TFTs and the second set of TFTs are turned on alternatively when the nodes PD1 and PD2 are at the high potential alternatively. The potentials at the PU node and the OUTPUT node can be pulled down when any one of the sets of TFTs are turned on.

The potential at the node PD1 is controlled by the TFTs M14 and M7 while the potential at the node PD2 is controlled by the TFTs M5 and M9. When the CLK signal is at the high potential, the M14 may be turned on, and in turn the M7 is turned on and outputs the CLK signal to the PD1; and when the CLKB is at the high potential, the M9 may be turned on, and in turn the M5 is turned on and outputs the CLKB signal to the PD2.

Meanwhile, when one node is at the high potential, the potential at the other node would be pulled down by another TFT. Particularly, as illustrated in FIG. 6, Since the source of the M7 receives the CLK, the PD1 is at the high potential when the CLK is at the high potential, and the turning-on of the M20 may pull down the potential at the PD2; to the contrary, the PD2 is at the high potential when the CLKB is at the high potential, and the turning-on of the M19 may pull down the potential at the PD1.

Therefore, the PD1 and PD2 are at the high potential alternatively when the CLKB and CLK are at the high potential alternatively.

In the circuit structure shown in FIG. 6, the association unit is further included and the association unit comprises the M6, M8, M15 and the M16, wherein:

regarding M6 and M16, their gates are connected with the PU, their source are connected with the PD2 and PD1, respectively, and their drains are connected with the low potential signal VSS; and regarding M8 and M15, their gates are connected with the PU, their source are connected with the PD_CN2 and PD_CN1, respectively, and their drains are connected with the low potential signal VSS.

The M6 and M16 are turned on when the PU is at the high potential, the low potential signal VSS are outputted to the PD2 and PD1 through the M6 and M16, respectively, so that the PD2 and PD1 are at the low potential. Meanwhile the M8 and M15 are turned on when the pulling-up node PU is at the high potential, the low potential signal VSS may be outputted to the gates of the TFTs M5 and M7, so that the TFTs M5 and M7 are turned off, and in turn the CLK and CLKB can not be outputted to the PD1 and PD2, which ensures the OUTPUT node to output the high potential signal normally.

In the circuit structure shown in FIG. 6, the resetting unit comprises following TFTs: M2 and M4. When the reset signal terminal RESET is inputted the high potential signal, the M2 and M4 are turned on, wherein the turning-on of the M2 may pull down the PU node, while the turning-on of the M4 may pull down the OUTPUT node.

An operational process of the shift register shown in FIG. 6 is omitted herein.

The above embodiments of the disclosure are only illustrative and are not intended to limit the scope of the invention in any way. Those skilled in the art should appreciate that many modifications, variations or equivalences can be made without departing from the spirit and scope of the disclosure, and such modifications, variations or equivalences are intended to be included within the scope defined by the following claims.

What is claimed is:

1. A shift register unit comprising a capacitor, wherein one terminal of the capacitor is connected with an outputting node at a present stage, and the other terminal of the capacitor is connected with a pulling-up node, and the shift register unit further comprises:

a first thin film field effect transistor, a drain thereof connected with a first signal terminal, a source thereof connected with the outputting node at the present stage, a gate thereof connected with a first node; wherein the first signal terminal is configured to output a low potential signal when the first thin film field effect transistor is turned on;

a second thin film field effect transistor, a drain thereof connected with the first signal terminal, a source thereof connected with the pulling-up node, and a gate thereof connected with the first node; wherein the first signal terminal is configured to output the low potential signal when the second thin film field effect transistor is turned on;

a third thin film field effect transistor, a drain thereof connected with a second signal terminal, a source thereof connected with the outputting node at the present stage, and a gate thereof connected with a second node; wherein the second signal terminal is configured to output the low potential signal when the third thin film field effect transistor is turned on;

a fourth thin film field effect transistor, a drain thereof connected with the second signal terminal, a source thereof connected with the pulling-up node, and a gate thereof connected with the second node; wherein the second signal terminal is configured to output the low potential signal when the fourth thin film field effect transistor is turned on; and a node voltage control module, configured to control the first node and the second node to be in a high potential state alternatively when the shift register unit is in a pulling-down phase; and a first resetting unit configured to output the low potential signal to the pulling-up node and the outputting node at the present stage under a control of a reset signal, wherein the first resetting unit comprises:

a first resetting thin film field effect transistor, a source thereof configured to receive a first clock control signal, a drain thereof connected with the first node, and a gate thereof configured to receive the reset signal; and a second resetting thin film field effect transistor, a source thereof configured to receive a second clock control signal, a drain thereof connected with the second node, and a gate thereof configured to receive the reset signal;

wherein the node voltage control module comprises a first node voltage control sub-module, and the first node voltage control sub-module comprises:

a fifth thin film field effect transistor, a source and a gate thereof configured to receive the first clock control signal, and a drain thereof connected with the first node; and a sixth thin film field effect transistor, a drain thereof configured to receive the low potential signal, a source thereof connected with the second node, and a gate thereof configured to receive the first clock control signal.

2. The shift register unit of claim 1, further comprising:
a first association unit, configured to output the low potential signal to the first node and the second node when the pulling-up node is at a high potential.

3. The shift register unit of claim 1, wherein:
the node voltage control module further comprises a second node voltage control sub-module;
wherein the second node voltage control sub-module comprises:
a seventh thin film field effect transistor, a source and a gate thereof configured to receive a second clock control signal, and a drain thereof connected with the second node; and
an eighth thin film field effect transistor, a drain thereof configured to receive the low potential signal, a source thereof connected with the first node, and a gate thereof configured to receive the second clock control signal, wherein
phases of the second clock control signal and the first clock control signal are opposite.

4. The shift register unit of claim 1, wherein the first resetting unit further comprises:
a third resetting thin film field effect transistor, a drain thereof configured to receive the low potential signal, a source thereof connected with the pulling-up node, and a gate thereof configured to receive the reset signal.

5. A gate driving apparatus comprising the shift register unit of claim 1.

6. A display device comprising the gate driving apparatus of claim 5.

7. The gate driving apparatus of claim 5, wherein the shift register unit further comprises:
a first association unit, configured to output the low potential signal to the first node and the second node when the pulling-up node is at a high potential.

8. The gate driving apparatus of claim 5, wherein the node voltage control module further comprises a second node voltage control sub-module;
wherein,
the second node voltage control sub-module comprises:
a seventh thin film field effect transistor, a source and a gate thereof configured to receive a second clock control signal, and a drain thereof connected with the second node; and
an eighth thin film field effect transistor, a drain thereof configured to receive the low potential signal, a source thereof connected with the first node, and a gate thereof configured to receive the second clock control signal, wherein
phases of the second clock control signal and the first clock control signal are opposite.

9. The gate driving apparatus of claim 8, wherein the first resetting unit further comprises:
a third resetting thin film field effect transistor, a drain thereof configured to receive the low potential signal, a source thereof connected with the pulling-up node, and a gate thereof configured to receive the reset signal.

10. A shift register unit comprising a capacitor, wherein one terminal of the capacitor is connected with an outputting node at a present stage, and the other terminal of the capacitor is connected with a pulling-up node, and the shift register unit further comprises:
a first thin film field effect transistor, a drain thereof connected with a first signal terminal, a source thereof connected with the outputting node at the present stage, a gate thereof connected with a first node; wherein the first signal terminal is configured to output a low potential signal when the first thin film field effect transistor is turned on;
a second thin film field effect transistor, a drain thereof connected with the first signal terminal, a source thereof connected with the pulling-up node, and a gate thereof connected with the first node; wherein the first signal terminal is configured to output the low potential signal when the second thin film field effect transistor is turned on;
a third thin film field effect transistor, a drain thereof connected with a second signal terminal, a source thereof connected with the outputting node at the present stage, and a gate thereof connected with a second node; wherein the second signal terminal is configured to output the low potential signal when the third thin film field effect transistor is turned on;
a fourth thin film field effect transistor, a drain thereof connected with the second signal terminal, a source thereof connected with the pulling-up node, and a gate thereof connected with the second node; wherein the second signal terminal is configured to output the low potential signal when the fourth thin film field effect transistor is turned on; and
a node voltage control module, configured to control the first node and the second node to be in a high potential state alternatively when the shift register unit is in a pulling-down phase;
wherein, the node voltage control module comprises a third node voltage control sub-module and a fourth node voltage control sub-module;
wherein, the third node voltage control sub-module comprises:
a twelfth thin film field effect transistor, a source and a gate thereof configured to receive a third clock control signal, and a drain thereof connected with a gate of a thirteenth thin film field effect transistor;
the thirteenth thin film field effect transistor, a source thereof configured to receive the third clock control signal and a drain thereof connected with the first node; and
a fourteenth thin film field effect transistor, a drain thereof configured to receive the low potential signal, a source thereof connected with the second node, and a gate thereof configured to receive the third clock control signal;
the fourth node voltage control sub-module comprises:
a seventeenth thin film field effect transistor, a drain thereof configured to receive the low potential signal, a source thereof connected with the first node, and a gate thereof configured to receive a fourth clock control signal,
wherein phases of the fourth clock control signal and the third clock control signal are opposite.

11. The shift register unit of claim 10, wherein the fourth node voltage control sub-module further comprises:
a fifteenth thin film field effect transistor, a source and a gate thereof configured to receive a fourth clock control signal, and a drain thereof connected with a gate of a sixteenth thin film field effect transistor; and
the sixteenth thin film field effect transistor, a source thereof configured to receive the fourth clock control signal and a drain thereof connected with the second node.

12. The shift register unit of claim 11, further comprising:
a second association unit, configured to turn off both the thirteenth thin film field effect transistor and the sixteenth thin film field effect transistor when the pulling-up node is at the high potential, and meanwhile to output the low potential signal to the first node and the second node.

13. The shift register unit of claim 11, further comprising a second resetting unit configured to output the low potential signal to the pulling-up node and the outputting node at the present stage under the control of a reset signal, wherein the second resetting unit comprises:
- an eighteenth thin film field effect transistor, a drain thereof configured to receive the low potential signal, a source thereof connected with the pulling-up node, and a gate thereof configured to receive the reset signal; and
- a nineteenth thin film field effect transistor, a drain thereof configured to receive the low potential signal, a source thereof connected with the outputting node at the present stage, and a gate thereof configured to receive the reset signal.

14. A gate driving apparatus comprising the shift register unit of claim 10.

15. The gate driving apparatus of claim 14, wherein:
the fourth node voltage control sub-module further comprises:
- a fifteenth thin film field effect transistor, a source and a gate thereof configured to receive a fourth clock control signal, and a drain thereof connected with a gate of a sixteenth thin film field effect transistor; and
- the sixteenth thin film field effect transistor, a source thereof configured to receive the fourth clock control signal and a drain thereof connected with the second node.

16. The gate driving apparatus of claim 15, wherein the shift register unit further comprises a second association unit, configured to turn off both the thirteenth thin film field effect transistor and the sixteenth thin film field effect transistor when the pulling-up node is at the high potential, and meanwhile to output the low potential signal to the first node and the second node.

17. The gate driving apparatus of claim 15, wherein the shift register unit further comprises a second resetting unit configured to output the low potential signal to the pulling-up node and the outputting node at the present stage under the control of a reset signal, wherein the second resetting unit comprises:
- an eighteenth thin film field effect transistor, a drain thereof configured to receive the low potential signal, a source thereof connected with the pulling-up node, and a gate thereof configured to receive the reset signal; and
- a nineteenth thin film field effect transistor, a drain thereof configured to receive the low potential signal, a source thereof connected with the outputting node at the present stage, and a gate thereof configured to receive the reset signal.

18. The shift register unit of claim 10 further comprising:
- a first association unit, configured to output the low potential signal to the first node and the second node when the pulling-up node is at a high potential.

19. The gate driving apparatus of claim 14, wherein the shift register unit further comprises:
- a first association unit, configured to output the low potential signal to the first node and the second node when the pulling-up node is at a high potential.

* * * * *